(12) United States Patent
Yang et al.

(10) Patent No.: US 7,884,487 B2
(45) Date of Patent: Feb. 8, 2011

(54) ROTATION JOINT AND SEMICONDUCTOR DEVICE HAVING THE SAME

(75) Inventors: Se-Young Yang, Seoul (KR); Wang-Ju Lee, Chungcheongnam-do (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 475 days.

(21) Appl. No.: 11/942,483

(22) Filed: Nov. 19, 2007

(65) Prior Publication Data

US 2008/0122108 A1 May 29, 2008

(30) Foreign Application Priority Data

Nov. 28, 2006 (KR) ................. 10-2006-0118553

(51) Int. Cl.
*H01L 23/48* (2006.01)
(52) U.S. Cl. .............. 257/780; 257/773; 257/778; 257/782; 280/180
(58) Field of Classification Search ......... 257/700–799; 228/180
See application file for complete search history.

(56) References Cited

U.S. PATENT DOCUMENTS

| 4,565,314 A | * | 1/1986 | Scholz ............... 228/180.21 |
| 2008/0018000 A1 | * | 1/2008 | Krishnamoorthy et al. .. 257/797 |

FOREIGN PATENT DOCUMENTS

| JP | 11-233561 | 8/1999 |
| KR | 2002-0059211 | 7/2002 |
| KR | 2003-0024533 | 3/2003 |

OTHER PUBLICATIONS

English language abstract of Japanese Publication No. 11-233561.
English language abstract of Korean Publication No. 2002-0059211.
English language abstract of Korean Publication No. 2003-0024533.

* cited by examiner

*Primary Examiner*—Leonardo Andújar
(74) *Attorney, Agent, or Firm*—Muir Patent Consulting, PLLC

(57) ABSTRACT

Provided are a rotation joint capable of compensating for a mismatch due to thermal expansion and a semiconductor device having the same. The rotation joint can include a support member and a first contact member coupled to a first portion of the support member such that a surface of the first contact member is moveable relative to a surface of the support member adjacent to the first contact member. The first contact member can include solder material.

17 Claims, 7 Drawing Sheets

US 7,884,487 B2

ROTATION JOINT AND SEMICONDUCTOR DEVICE HAVING THE SAME

CROSS-REFERENCE TO RELATED PATENT APPLICATION

This application claims the benefit of foreign priority to Korean Patent Application No. 10-2006-0118553, filed on Nov. 28, 2006, the disclosure of which is incorporated herein in its entirety by reference.

BACKGROUND

1. Field of Invention

Embodiments of the present invention relate generally to connecting elements and semiconductor devices having the same. More particularly, embodiments of the present invention relate to a rotation joint that can prevent mismatch due to thermal expansion and a semiconductor device (e.g., a package on package (POP), a flip-chip package, a wafer-level package (WLP), and a memory module) having the same.

2. Description of the Related Art

In general, it is desirable that semiconductor devices operate at room temperature. In many cases, however, semiconductor devices incorporated within, for example, spacecraft and military equipment, are used under severe temperature conditions and need to operate properly in the presence of sudden temperature variations.

Meanwhile, semiconductor devices (e.g., semiconductor packages, memory modules or the like) may suffer from problems due to a difference in the coefficient of thermal expansion (CTE) among internal elements, such as a semiconductor chip, a solder ball (or a bump), and a printed circuit board (PCB). A typical problem is that frequent sudden temperature variations can lead to deterioration of solder joint reliability (SJR) in semiconductor devices. Reliability problems such as SJR may be easily confirmed via a temperature cycling test. The temperature cycling test includes inspecting the state and functions of a semiconductor device while maintaining the semiconductor device at temperatures between −55° C. and 125° C. for 5 or 10 minutes for each process several tens or hundred of times.

FIG. 1 is a cross sectional view of a semiconductor device having a conventional solder ball or a bump.

Referring to FIG. 1, in a semiconductor device 20, such as a flip-chip or a memory module, a semiconductor chip 40 is electrically connected to a PCB 30 using bumps or solder balls 10. However, the semiconductor chip 40, the bumps 10, and the PCB 30 of the semiconductor device 20 have different coefficients of thermal expansion. Thus, when frequent and sudden variations in the temperature of the environment within which the semiconductor device 20 occurs, stress can be concentrated on the semiconductor chip 40 as indicated by the arrows. Moreover, the stress usually becomes worse as the magnitude of temperature variation increases.

FIG. 2 is a cross sectional view illustrating defects generated within semiconductor device shown in FIG. 1 due to CTE mismatch.

Referring to FIG. 2, a solder ball 10' connects the semiconductor chip 40 and the PCB 30. When stress is repetitively applied to the solder ball 10' due to a CTE mismatch between the semiconductor chip 40 and the PCB 30, the mechanical endurance of the solder ball 10' deteriorates and cracks 12 and 14 are generated along a generally horizontal direction. In FIG. 2, a bond pad 46 is formed on the surface of the semiconductor chip 40, while a solder ball pad 33 is formed on the surface of the PCB 30.

As described above, defects such as the cracks 12 and 14 are generated in the solder ball 10' (or the bump 10), thus lowering the reliability of the semiconductor device 20. Therefore, it would be desirable to prevent the occurrence of such defects that lead to generation of leakage current.

SUMMARY

Embodiments of the present invention can be generally characterized as providing a rotation joint capable of connecting, for example, internal components of a semiconductor device while compensating for a mismatch in coefficients of thermal expansion between such internal components.

One embodiment exemplarily described herein can be generally characterized as a rotation joint that includes a support member and a first contact member coupled to a first portion of the support member such that a surface of the first contact member is moveable relative to a surface of the support member adjacent to the first contact member. The first contact member may include solder material and the rotation joint may be structured to connect electrical components within a semiconductor device.

Another embodiment exemplarily described herein can be generally characterized as a semiconductor device that includes a first component having a first coefficient of thermal expansion, a second component having a second coefficient of thermal expansion different from the first coefficient of thermal expansion and a rotation joint electrically connecting the first component with the second component. The rotation joint may, for example, include a support member and a first contact member coupled to a first portion of the support member such that a surface of the first contact member is moveable relative to a surface of the support member adjacent to the first contact member. The first contact member may include a solder material and the first component may be attached to the first contact member.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION

Exemplary embodiments of the present invention will now be described more fully hereinafter with reference to the accompanying drawings. These embodiments may, however, be realized in different forms and should not be construed as being limited to the description explicitly set forth herein. Rather, these embodiments are provided so that this disclosure is thorough and complete and fully conveys the scope of the invention to those skilled in the art.

Figure 1:
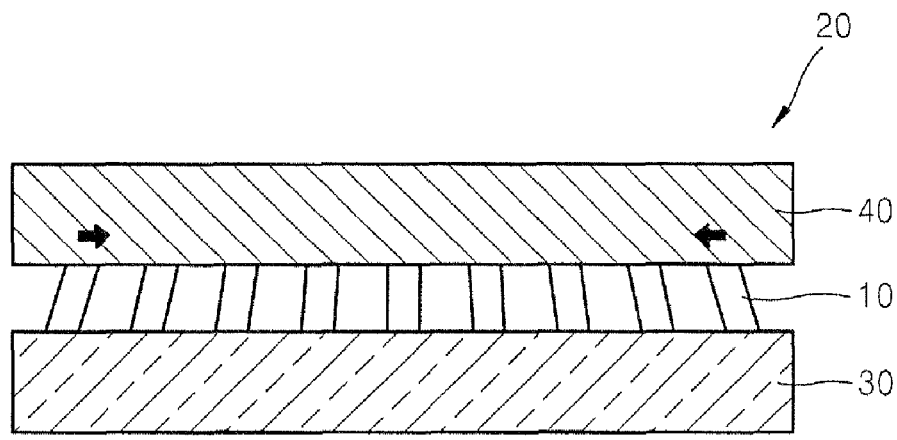
FIG. 1 is a cross sectional view of a semiconductor device having a conventional solder ball or a bump.
Figure 2:
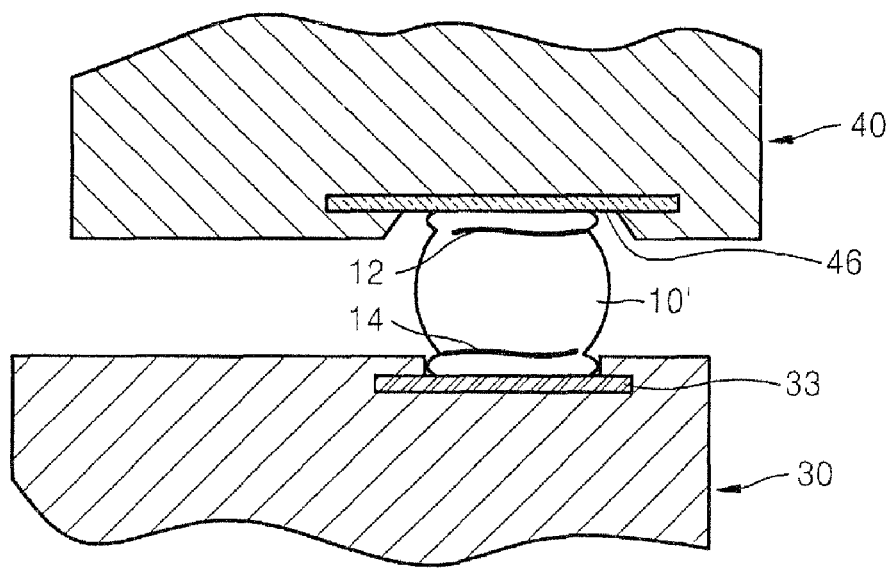
FIG. 2 is a cross sectional view illustrating defects generated within semiconductor device shown in FIG. 1 due to CTE mismatch.
Figure 3:
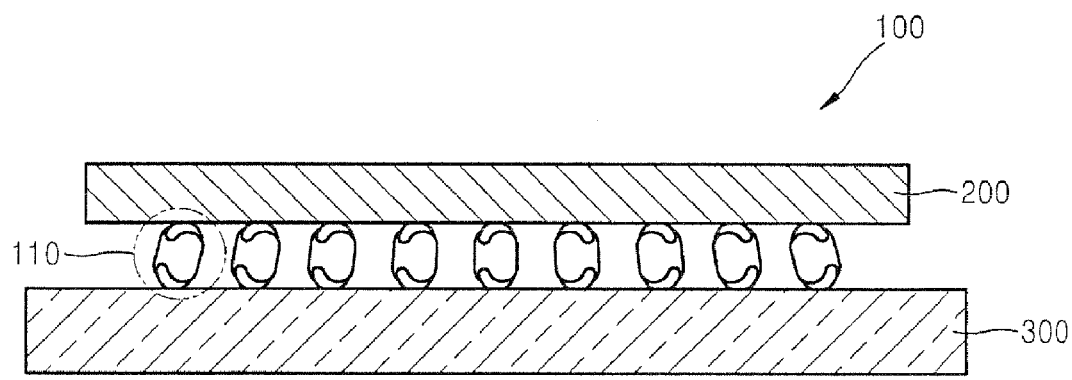
FIG. 3 is a cross sectional view of one embodiment of a semiconductor device incorporating a rotation joint capable of compensating for a CTE mismatch of components within the semiconductor device.
Figure 4:
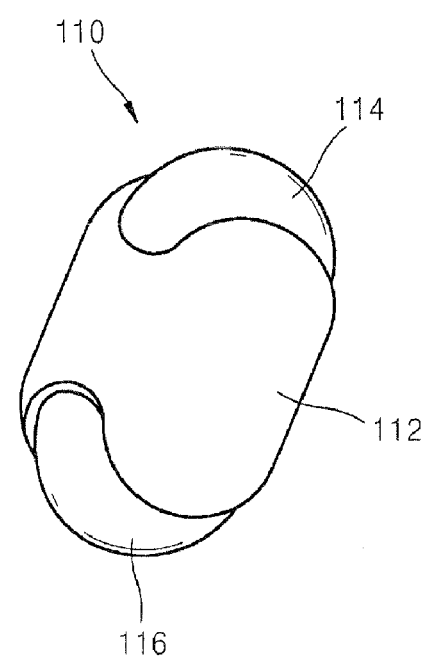
FIG. 4 is a magnified perspective view of the rotation joint shown in FIG. 3.

FIG. 3 is a cross sectional view of one embodiment of a semiconductor device incorporating a rotation joint capable of compensating for a CTE mismatch of components within the semiconductor device. FIG. 4 is a magnified perspective view of the rotation joint shown in FIG. 3.

Referring to FIGS. 3 and 4, a rotation joint 110 may be provided as a connecting element. In some embodiments, the rotation joint 110 may replace conventional solder balls or bumps. In some embodiments, the rotation joint 110 may, for example, include a support member 112 and first and second contact members 114 and 116, respectively, located at end portions of the support member 112. In some embodiments, the first and second contact members 114 and 116 may be provided as solder balls. One end of each of the first and second contact members 114 and 116 may be attached to, for example, a semiconductor chip 200 or a PCB 300, and another end of each of the first and second contact members 114 and 116 may be rotatably coupled to the support member 112. The rotation joint 110 exemplarily shown in FIGS. 3 and 4 may be incorporated within, for example, a flip-chip package, a memory module, a wafer-level package or the like. As used herein, the semiconductor chip and PCB may also be generically referred to as components of the semiconductor device 100.

In some embodiments, the rotation joint 110 may be structured to compensate for a CTE mismatch between the components of the semiconductor device 100. This will be described with reference to FIG. 4.

Referring to FIG. 4, the support member 112 may include a contact member support portion 118 (see, e.g., FIG. 9), within which the first and second contact members 114 and 116 may be disposed. The first contact member 114 may be disposed within a contact member support portion 118 located at one end of the support member 112 and be attached to the PCB 300 or the semiconductor chip 200 in a semiconductor package 100. Similarly, the second contact member 116 may be disposed within a contact member support portion 118 located at another end of the support member 112 and be attached to the other of the semiconductor chip 200 or PCB 300 in the semiconductor package 100.

In some embodiments, the rotation joint 110 may be designed such that the first and second contact members 114 and 116, each having a substantially spherical shape, can rotate substantially freely with respect to the support member 112. Thus, even if differences in CTEs between the semiconductor chip 200 and the PCB 300 cause these components to expand or contract by differing amounts, the rotation joint 110 can substantially alleviate any stress when the first and second contact members 114 and 116 rotate with respect to the support member 112. As a result, the formation of cracks in structures that connect the semiconductor chip 200 and the PCB 300 may be substantially prevented.

According to some embodiments, the support member 112 and the first and second contact members 114 and 116 may be formed of a conductive material. In some further embodiments, the support member 112 and the first and second contact members 114 and 116 may be formed of a conductive material that is relatively rigid in the sense that neither the support member 112 or the first and second contact members 114 and 116, individually, experience significant deformation when exposed to the environment in which the semiconductor device 100 is placed. Nevertheless, the conductive material of the support member 112 and the first and second contact members 114 and 116 may comprise a material which is highly resistant to abrasion and sufficiently hard to compensate for the possibility that surfaces of the first and second contact members 114 and 116 and the support member 112 may become worn or rough due to repetitive rotations.

Figure 5:
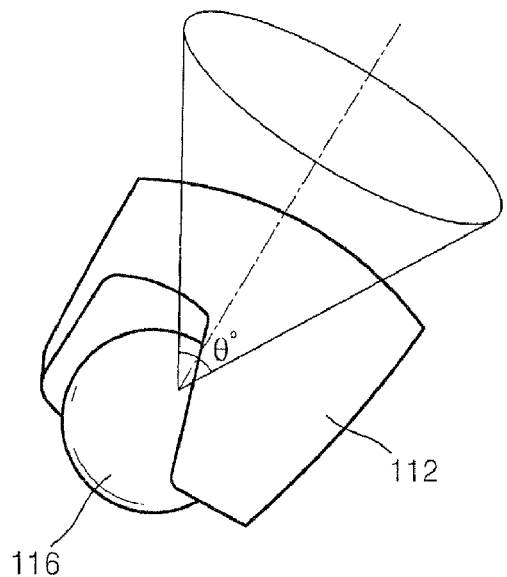
FIG. 5 is a perspective view showing a rotation angle of the support member shown in FIG. 4.

FIG. 5 is a perspective view showing a rotation angle of the second contact member shown in FIG. 4.

Referring to FIG. 5, an end portion of the second contact member 116 may be fixedly attached to one of the semiconductor chip 200 or the PCB 300 (not shown) while the support member 112, which is rotatably coupled to the second contact member 116, is capable of rotating at an angle θ. Thus, the second contact member 116 is capable of rotating with respect to the support member 112. Stress caused by CTE mismatch between the semiconductor chip 200 and the PCB 300 may be effectively compensated for when the second contact member 116 rotates at an angle θ that is less than about 10°. Also, since the support member 112 is capable of rotating in any direction as shown in FIG. 5, the occurrence of defects, such as cracks, may be prevented regardless of a direction of expansion or contraction CTE mismatch between components of the semiconductor device 100. Although only the second contact member 116 is shown FIG. 5, it will be appreciated that the support member 112 may rotate in a similar manner when one end of the first contact member 114 is fixedly attached to the other of the PCB 300 or the semiconductor chip 200.

Figure 6:
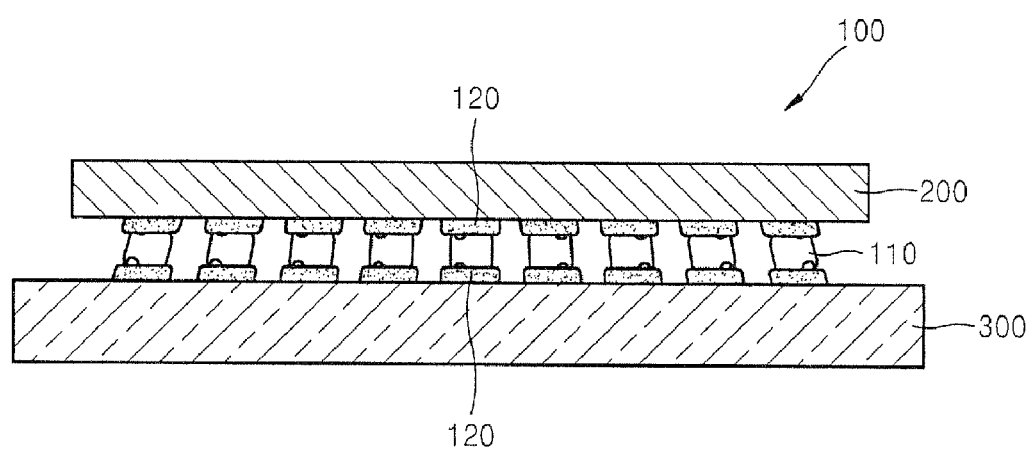
FIG. 6 is a cross sectional view of a modified example of the semiconductor device of FIG. 3 in which a conductive lubricant material is formed on the surface of a component of the semiconductor device.
Figure 7:
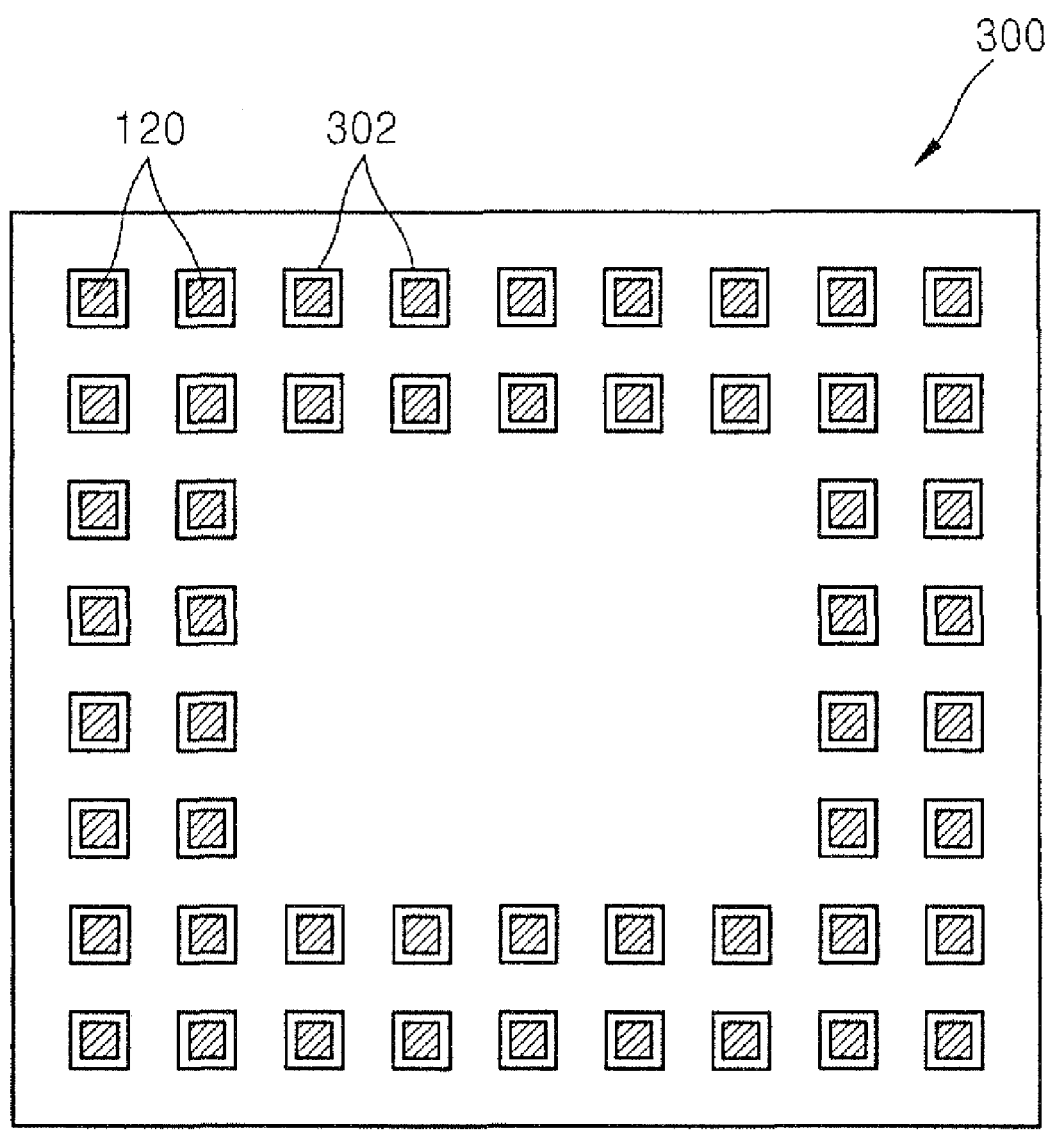
FIG. 7 is a plan view showing the formation of the conductive lubricant material shown in FIG. 6.

FIG. 6 is a cross sectional view of a modified example of the semiconductor device shown in FIG. 3, in which a conductive lubricant material is formed on the surface of the PCB. FIG. 7 is a plan view showing the formation of the conductive lubricant material of FIG. 6 on the surface of the PCB.

Referring to FIGS. 6 and 7, a contact member may generate friction as it rotates within the support member 112. Thus, as shown in FIG. 6, a conductive lubricant material 120 may be coated on the surface of the semiconductor chip 200 or the PCB 300 in order to effectively diminish any abrasion that may be caused by the friction. In some embodiments, the conductive lubricant material 120 may comprise a solder paste, a solder cream, or the like or combinations thereof. Also, as shown in FIG. 7, the conductive lubricant material 120 may be coated only on, for example, a solder ball pad 302 of the PCB 300 to which the rotation joint 110 is attached so that a short between adjacent terminals can be prevented.

Figure 8:
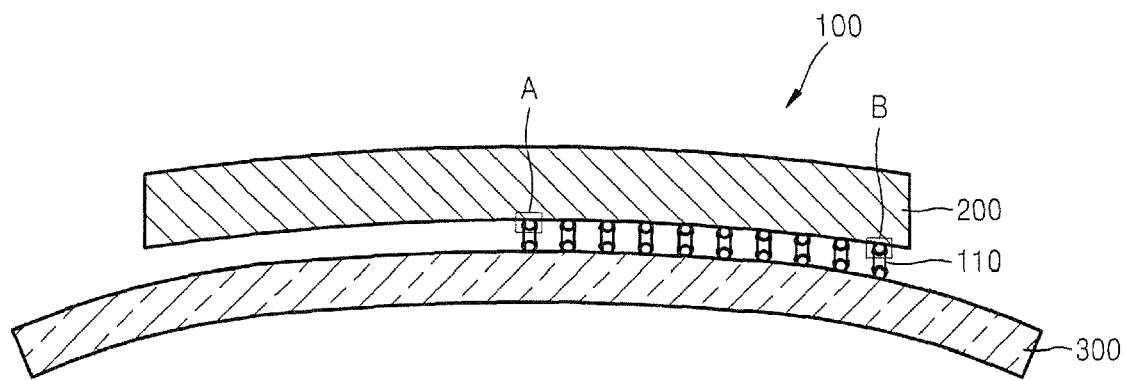
FIG. 8 is a cross sectional view showing the occurrence of a warpage defect in the semiconductor device shown in FIG. 3.
Figure 9:
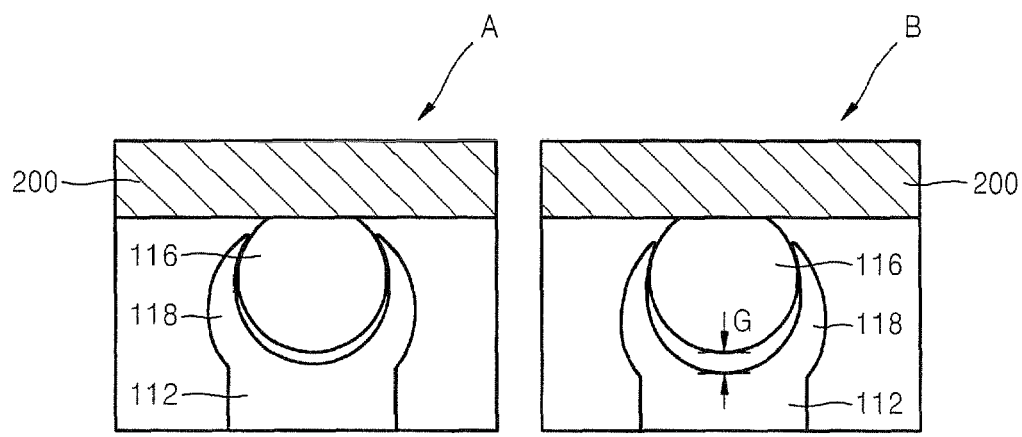
FIG. 9 is a cross sectional view showing an operation of the rotation joint shown in FIG. 8.

FIG. 8 is a cross sectional view showing the occurrence of a warpage defect in the semiconductor device shown in FIG. 3 and FIG. 9 is a cross sectional view showing an operation of the rotation joint shown in FIG. 8.

Referring to FIGS. 8 and 9, because of a difference in coefficients of thermal expansion between the elements of the semiconductor device 100, the semiconductor device 100 may not be deformed only in X and Y directions (i.e., in horizontal directions), but it may also be deformed in a Z direction (i.e., in a vertical direction). As a result, warpage may occur in the semiconductor device 100 such that a distance between semiconductor chip 200 and the PCB 300 near region "A" is less than a distance between semiconductor chip 200 and the PCB 300 near region "B".

Accordingly, rotation joints 110 connecting the semiconductor chip 200 and the PCB 300 may be structured such that the contact member (e.g., the illustrated second contact member 116) is spaced apart from the contact member support 118 to form a gap "G." Structured as described above, the rotation joints 110 may effectively compensate for vertical deformation that may occur due to CTE mismatch between components of the semiconductor device 100. For this effect, the support member 112 may comprise a material such as copper or aluminum. The size of the gap "G" may be controlled according to, for example, the height of the rotation joints 110 in the "A" and "B" regions.

Figure 10:
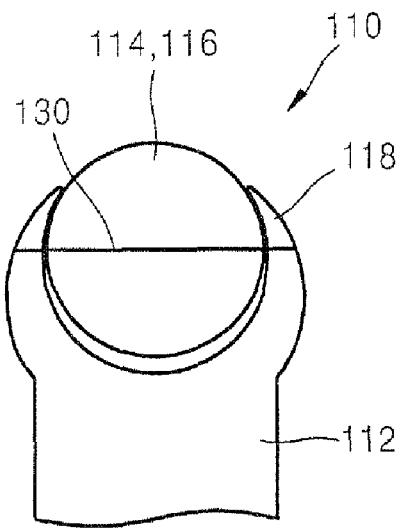
FIGS. 10 and 11 are cross sectional views illustrating some embodiments in which a connection member extends between a contact member and a support member.
Figure 11:
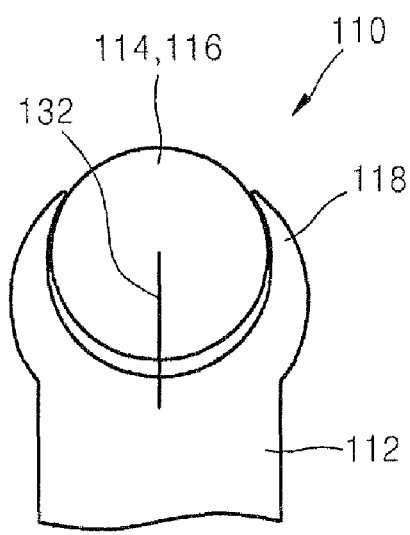

FIGS. 10 and 11 are cross sectional views illustrating some embodiments in which a connection member extends between a contact member and a support member.

Referring to FIGS. 10 and 11, a rotation joint 110 according to some embodiments may include a connection member 130 or 132 comprising a flexible material. As illustrated, the wire 130 or 132 may be installed at a contact member support portion 118. FIG. 10 shows one embodiment in which the connection member 130 is connected to the support member 112 substantially perpendicularly with respect to a longitudinal axis of the support member 112. FIG. 11 shows another embodiment in which the connection member 132 is connected to the support member 112 substantially in parallel with the longitudinal axis of the support member 112. The connection members 130 and 132 may comprise a material such as an alloy of copper (Cu) and tin (Sn). Accordingly, the connection members 130 and 132 may mechanically and electrically connect the contact members with corresponding contact member support portions 118. In some embodiments, the connection members 130 and 132 may be provided as wires.

Figure 12:
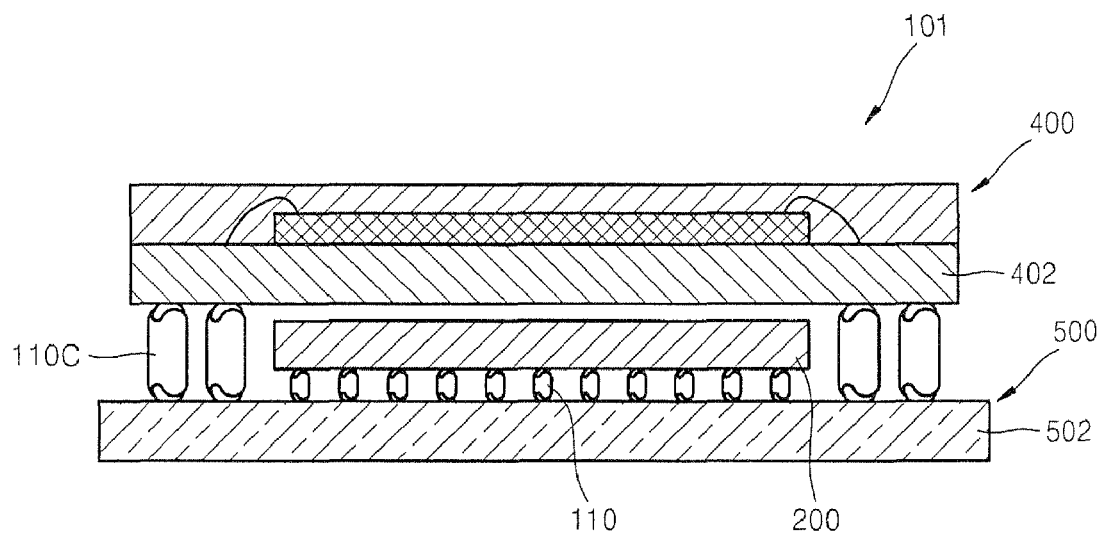
FIG. 12 is a cross sectional view of another embodiment of a semiconductor device incorporating a rotation joint.

FIG. 12 is a cross sectional view of a semiconductor device including a rotation joint according to another embodiment.

In FIG. 3, the rotation joint 110 is exemplarily used to electrically connect the semiconductor chip 200 with the PCB 300. However, the embodiment exemplarily illustrated in FIG. 12 shows where a rotation joint 110C, similar to the rotation joint 110 exemplarily described with respect to FIG. 3, may be used to connect an upper semiconductor package 400 with a lower semiconductor package 500. In FIG. 12, a rotation joint 110C may be used to connect a PCB 402 of the upper semiconductor package 400 with a PCB 502 of the lower semiconductor package 500 in a package-on-package (POP) 101.

According to the embodiments exemplarily described above, even if stress is induced due to a difference in coefficients of thermal expansion among a semiconductor chip, a bump, and a PCB in a semiconductor device, such as a POP, a flip-chip package, a wafer-level package (WLP), and a memory module, the stress may be compensated for by the rotation of a contact member of a rotation joint, so that the occurrence of defects, such as cracks, may be prevented.

As also described above, the rotation joint may, for example, include a support member including a first contact member support having a lateral surface on which a first contact member is mounted, wherein the first contact member is attached to one of a printed circuit board (PCB) and a semiconductor chip disposed in a semiconductor device.

The support member may further include a second contact member support mounted in an opposite direction to the lateral surface, and the second contact member support may include a second contact member attached to one of the PCB and the semiconductor chip disposed in the semiconductor device.

In some embodiments, the first and second contact members may be solder-ball type bearing joints rotatable in the support member.

In some embodiments, the first contact member may be mounted such that a specific gap is formed between the first contact member and the first contact member support. The first contact member support may be electrically connected to the first contact member using, for example, a flexible wire. The flexible wire may be arranged in parallel or perpendicular to the joint.

In some embodiments, the support member and the first contact member may be formed of a conductive material.

In some embodiments, a semiconductor device may be provided which is capable of compensating for a mismatch due to thermal expansion. The device may include a first component; a second component to be electrically connected to the first component; and a rotation joint used for electrically connecting the first component with the second component.

In some embodiments, the first component may be a semiconductor chip and the second component may be a PCB. In this case, the second component may further include a conductive lubricant material coated on a surface thereof.

In some embodiments, the first component may be a first PCB and the second component may be a second PCB. In this case, the first and second components may further include a conductive lubricant material coated on surfaces thereof.

In some embodiments, the semiconductor device may be one of a package-on-package (POP), a flip-chip package, a wafer-level package (WLP), and a memory module.

While embodiments of the present invention have been particularly shown and described above, it will be understood by those of ordinary skill in the art that various changes in form and details may be made therein without departing from the spirit and scope of the present invention as defined by the following claims.

What is claimed is:

1. A rotation joint, comprising:
a support member;
a first contact member coupled to a first portion of the support member such that a surface of the first contact member is moveable relative to a surface of the support member adjacent to the first contact member; and
a second contact member coupled to a second portion of support member,
wherein the first contact member comprises solder, and
wherein the rotation joint is structured to connect electrical components within a semiconductor device.

2. The rotation joint of claim 1, wherein the first contact member is rotatably coupled to the first portion of the support member.

3. The rotation joint of claim 1, wherein the second contact member is rotatably coupled to the second portion of the support member.

4. The rotation joint of claim 1, wherein the support member comprises a conductive material.

5. A rotation joint, comprising:
a support member; and
a first contact member coupled to a first portion of the support member such that a surface of the contact member is moveable relative to a surface of the support member adjacent to the first contact member, wherein the first contact member comprises solder,
wherein the rotation joint is structured to connect electrical components within a semiconductor device,
wherein the support member comprises a first contact member support portion and wherein the first contact member is rotatable within the first contact member support portion, and
wherein at least a portion of the first contact member within the first contact member support portion is spaced apart from the first contact member support portion.

6. A rotation joint, comprising;
a support member;
a first contact member coupled to a first portion of the support member such that a surface of contact member is moveable relative to a surface of the support member adjacent to the first contact member; and
a connection member extending between a first contact member support portion and the first contact member,
wherein the first contact member comprises solder,
wherein the rotation joint is structured to connect electrical components within a semiconductor device, and
wherein the support member comprises the first contact member support portion and wherein the first contact member is rotatable within the first contact member support portion.

7. The rotation joint of claim 6, wherein the connection member is flexible.

8. The rotation joint of claim 6, wherein the connection member is connected to the first contact member support portion along a direction substantially parallel to an axis of the support member.

9. The rotation joint of claim 6, wherein the connection member is connected to the first contact member support portion along a direction substantially perpendicular to an axis of the support member.

10. A semiconductor device, comprising:
a first component having a first coefficient of thermal expansion;
a second component having a second coefficient of thermal expansion different from the first coefficient of thermal expansion; and
a rotation joint electrically connecting the first component with the second component,
wherein the rotation joint comprises:
a support member; and
a first contact member coupled to a first portion of the support member such that a surface of the first contact member is moveable relative to a surface of the support member adjacent to the first contact member,
wherein the first contact member comprises solder material, and
wherein the first component is attached to the first contact member.

11. The semiconductor device of claim 10, wherein the first contact member is rotatably coupled to the support member.

12. The semiconductor device of claim 10, wherein
the rotation joint further includes a second contact member coupled to a second portion of the support member,
the second component is attached to the second contact member, and
a configuration of the second contact member is substantially the same as a configuration of the first contact member.

13. The semiconductor device of claim 10, wherein the rotation joint further includes a first contact member support portion,
wherein the first contact member is rotatable within the first contact member support portion, and
wherein at least a portion of the first contact member within the first contact member support portion is spaced apart from the first contact member support portion.

14. The semiconductor device of claim 10, wherein the first component is a semiconductor chip and the second component is a PCB.

15. The semiconductor device of claim 10, wherein the first component is a first PCB and the second component is a second PCB.

16. The semiconductor device of claim 10, further comprising a conductive lubricant material coated on a surface of at least one of the first and second components.

17. The semiconductor device of claim 10, wherein the semiconductor device is one selected from the group consisting of a POP (package-on-package), a flip-chip package, a WLP (wafer-level package), and a memory module.

* * * * *